(12) United States Patent
Momota et al.

(10) Patent No.: US 8,198,697 B2
(45) Date of Patent: Jun. 12, 2012

(54) SEMICONDUCTOR DEVICE

(75) Inventors: Seiji Momota, Matsumoto (JP); Hitoshi Abe, Matsumoto (JP); Takeshi Fujii, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 181 days.

(21) Appl. No.: 12/816,487

(22) Filed: Jun. 16, 2010

(65) Prior Publication Data

US 2010/0321092 A1 Dec. 23, 2010

(30) Foreign Application Priority Data

Jun. 18, 2009 (JP) ................................ 2009-145554

(51) Int. Cl.
*H01L 31/058* (2006.01)
(52) U.S. Cl. ........................................ 257/467; 257/469
(58) Field of Classification Search .................. 257/467, 257/469
See application file for complete search history.

(56) References Cited

U.S. PATENT DOCUMENTS

| 4,866,401 A | 9/1989 | Terasima |
| 2007/0221994 A1 * | 9/2007 | Ishikawa et al. ............. 257/356 |

FOREIGN PATENT DOCUMENTS

| JP | 01-151265 A | 6/1989 |
| JP | 10-093085 A | 4/1998 |
| JP | 2004-363327 A | 12/2004 |
| JP | 2008-182835 A | 8/2008 |

* cited by examiner

*Primary Examiner* — Matthew Landau
*Assistant Examiner* — Robert Bachner
(74) *Attorney, Agent, or Firm* — Rossi, Kimms & McDowell LLP (57) ABSTRACT

An IGBT is disclosed which separated into two groups (first and second IGBT portions). First and second Zener diodes each composed of series-connected Zener diode parts are disposed so as to correspond to the groups respectively. Each of the first and second Zener diodes has an anode side connected to a corresponding one of first and second polysilicon gate wirings, and a cathode side connected to an emitter electrode. Temperature dependence of a forward voltage drop of each of first and second Zener diodes is used for reducing a gate voltage of a group rising in temperature to throttle a current flowing in the group and reduce the temperature of the group to thereby attain equalization of the temperature distribution in a surface of a chip. In this manner, it is possible to provide an MOS type semiconductor device in which equalization of the temperature distribution in a surface of a chip or among chips can be attained.

11 Claims, 12 Drawing Sheets

THE CENTRAL PORTION IS MADE SPARSE

SEMICONDUCTOR DEVICE

BACKGROUND OF THE INVENTION

A. Field of the Invention

The present invention relates to a semiconductor device. Particularly, it relates to a power semiconductor device such as an insulated gate bipolar transistor (IGBT), an insulated gate field effect transistor (MOSFET), etc. which is a semiconductor device having an insulated gate structure (MOS structure).

B. Description of the Related Art

Figure 13:
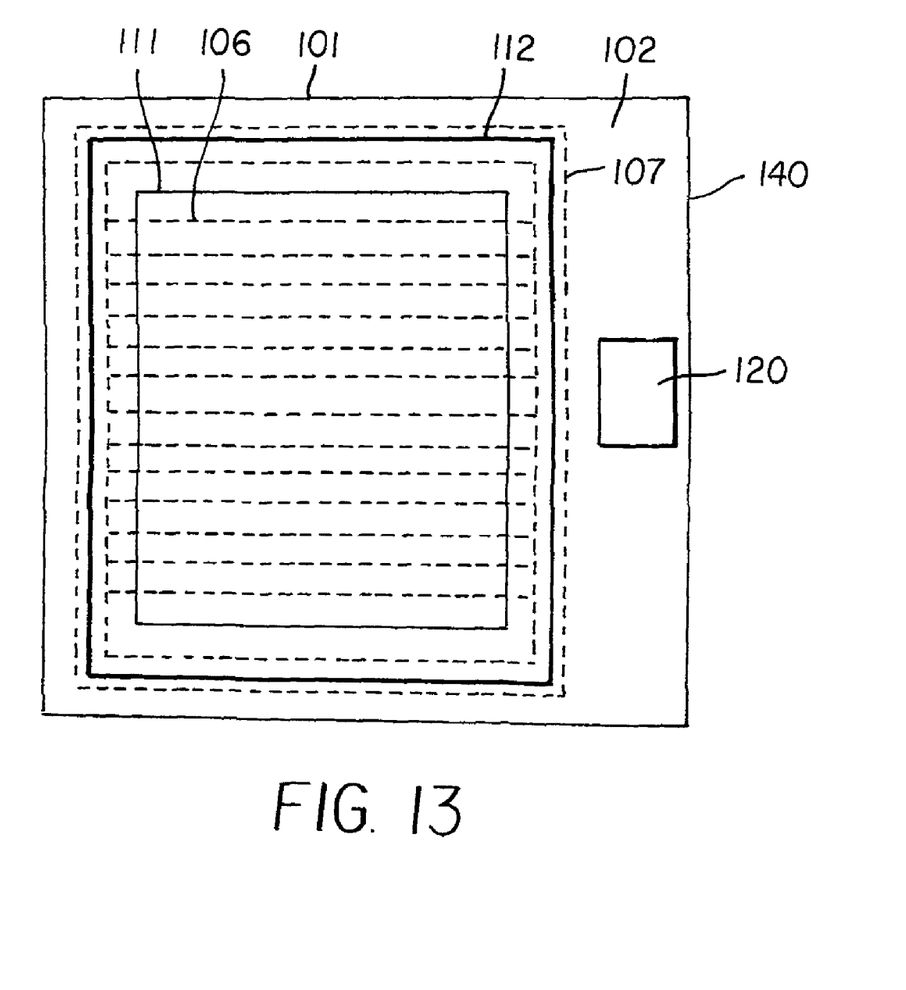
FIG. 13 is a schematic plan view of an IGBT according to the background art.

FIG. 13 is a schematic plan view of an IGBT according to the background art. In the following description, "n" expresses that the conductivity type of an impurity is an n type, and "p" expresses that the conductivity type of an impurity is a p type.

In FIG. 13, reference numeral 101 designates an n semiconductor substrate; 102, a p base region; 106, gate electrodes made of polysilicon; 107, a polysilicon gate wiring connected to the gate electrodes 106; 111, an emitter electrode; 112, a metal gate wiring formed on the polysilicon gate wiring 107; 120, a gate pad connected to the metal gate wiring 112; and 140, a semiconductor chip (hereinafter simply referred to as chip).

As shown in FIG. 13, in the IGBT having striped cells according to the background art, gate electrodes 106 shaped like stripes are arranged regularly on the whole surface of chip 140. That is, gate electrodes 106 are arranged linearly at intervals of an equal pitch which is common to the central portion and the peripheral portion of chip 140. Such regular arrangement is common to all gate structures regardless of whether the gate structure is a planar structure or a trench structure. In addition, such regular arrangement also applies also to a power MOSFET.

Figure 14A:
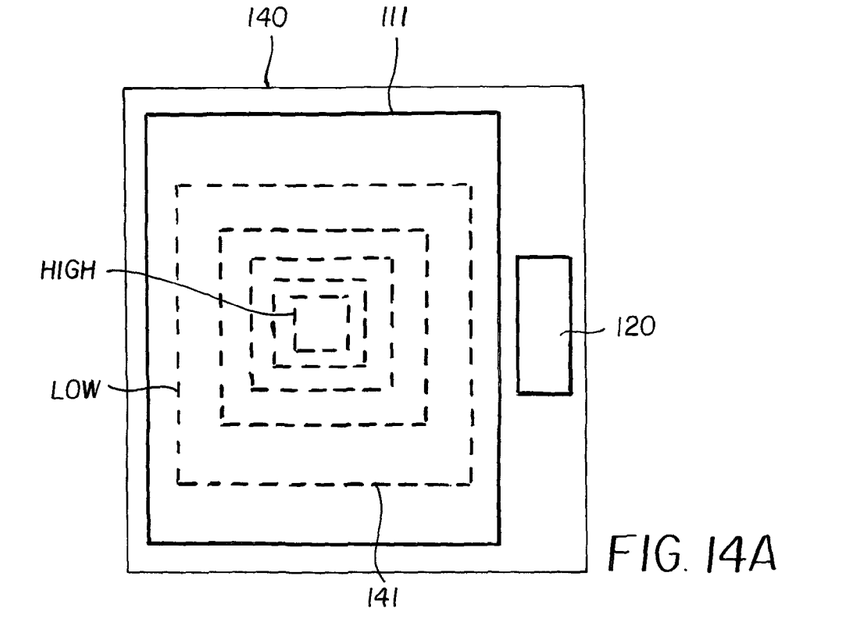
FIG. 14A is an isothermal chart showing the case where the temperature of the central portion of the chip is high.
Figure 14B:
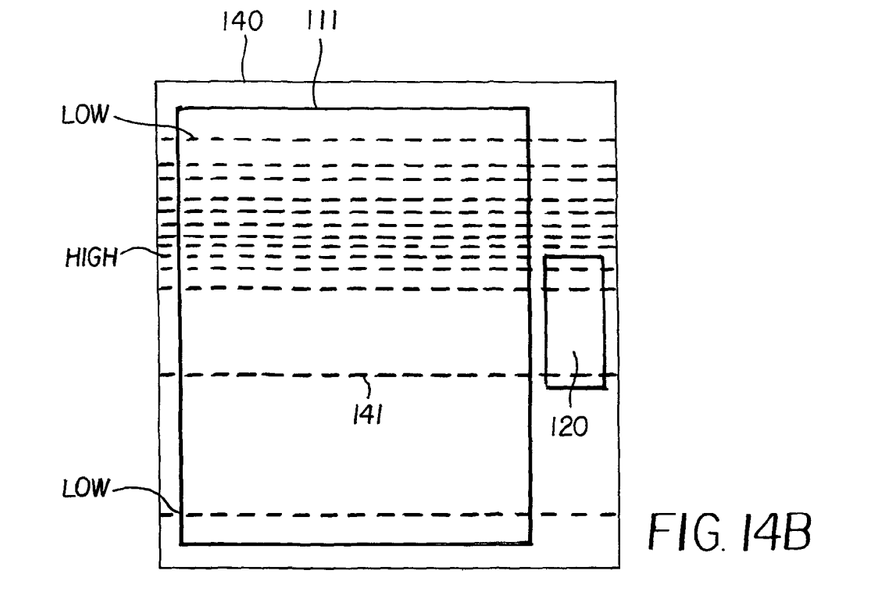
FIG. 14B is an isothermal chart showing the case where the temperature of a half of the chip is high.

FIGS. 14A and 14B are plan views schematically showing temperature distributions in a surface of the IGBT chip. FIG. 14A is an isothermal chart showing a situation where the temperature of the central portion is high. FIG. 14B is an isothermal chart showing a situation where the temperature of a half of the chip becomes high. In FIGS. 14A and 14B, dotted lines are isothermal lines 141.

As shown in FIG. 14A, in an ordinary IGBT, the temperature distribution in a surface of chip 140 is such a mountainous distribution that the temperature of the central portion of chip 140 is highest and the temperature decreases as the location goes from the central portion of chip 140 to the peripheral portion of chip 140.

Such a temperature distribution is caused by balance of heat generated due to a current flowing in chip 140 and heat radiated from a collector electrode in a rear surface not shown to the substrate in which chip 140 is mounted. The thermal path contributing to heat radiation in the central portion of chip 140 is only one path (vertical path) through which heat is transmitted in a depth direction of chip 140 mainly toward the collector electrode.

On the contrary, the thermal paths contributing to heat radiation in the peripheral portion of chip 140 are excellent in heat radiating property because the thermal paths are not only the aforementioned vertical path but also a path (horizontal path) through which heat is transmitted toward end portions of chip 140. Accordingly, the aforementioned mountainous temperature distribution is obtained. Such a temperature distribution is formed also in a power MOSFET.

On the other hand, the case where the temperature of a half (an upper half in FIG. 14B) of chip 140 reaches a high temperature as shown in FIG. 14B occurs when a bonding wire connected to emitter electrode 111 is fixed to only a lower half of chip 140 but there is no bonding wire in an upper half of chip 140.

If some void not shown is present in a solder layer under the collector electrode in the rear surface of chip 140, the thermal resistance of the void portion increases to generate heat so locally that the temperature distribution in a surface of chip 140 cannot be equalized.

Figure 15:
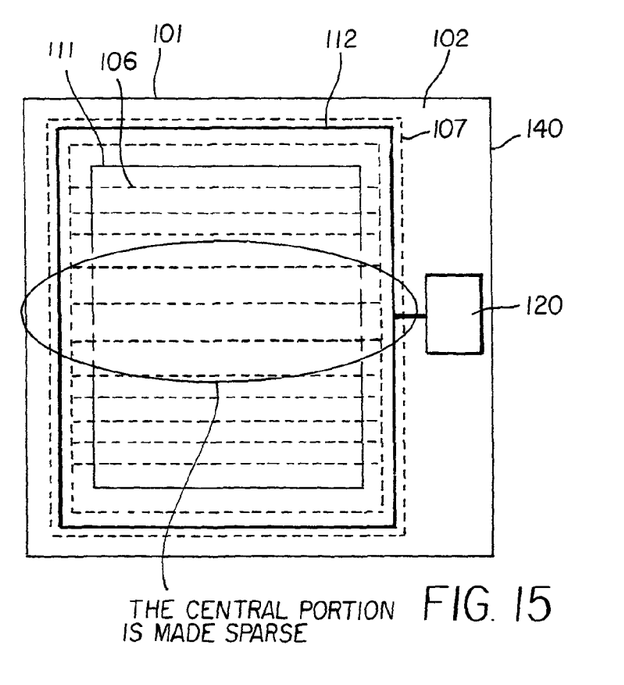
FIG. 15 is a plan view of important part in the case where gate electrodes are disposed sparsely in the central portion of the chip but disposed densely in the end portions of the chip.

A method of equalizing the temperature in the temperature distribution as shown in FIG. 14A has been described in JP-A-2004-363327. According to JP-A-2004-363327, in this method gate electrodes 106 are disposed sparsely in the central portion of chip 140 but are disposed densely in the vicinities of the end portions of chip 140 as shown in FIG. 15. Although the gate electrodes designated by broken lines in FIG. 15 are called "unit cells" in JP-A-2004-363327, the gate electrodes constituting the unit cells are extracted and shown here.

With this configuration, current density in the central portion becomes low but current density in the peripheral portion (the vicinities of the upper and lower end portions in FIG. 15) becomes high, so that the amount of heat generated in the central portion decreases but the amount of heat generated in the peripheral portion increases. On the other hand, the amount of heat radiated from the central portion decreases but the amount of heat radiated from the peripheral portion increases. Accordingly, the temperature distribution in a surface of chip 140 is equalized because of balance of the amount of generated heat and the amount of radiated heat.

In the method according to JP-A-2004-363327, the gate electrode (unit cell) densities in the peripheral portion and the central portion are determined at a manufacturing stage, so that it is however difficult to attain equalization of the temperature except in the case where the central portion of chip 140 rises in temperature.

Moreover, when current density becomes high as a current conducted becomes large, the difference between the amount of heat generated in the central portion and the amount of heat generated in the peripheral portion becomes so large that it is difficult to balance the amount of generated heat and the amount of radiated heat with each other in all the current density range on the whole surface of chip 140, that is, temperature unbalance can be merely improved in a limited current density range.

When the temperature distribution is as shown in FIG. 14B, it is necessary to dispose gate electrodes 106 in accordance with the temperature distribution, that is, it is unrealistically necessary to change the arrangement of the gate electrodes 106 in accordance with the temperature distribution at a manufacturing stage. Moreover, the method according to JP-A-2004-363327 cannot be applied to the case where the temperature distribution in a surface of chip 140 varies according to how to use.

Figure 16:
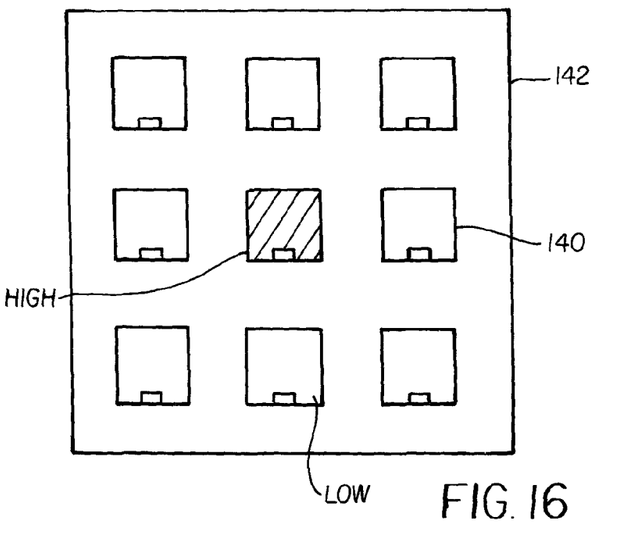
FIG. 16 is a schematic plan view of a background-art module having a large number of chips disposed therein, showing the case where a high-temperature chip and low-temperature chips are present in the module.

Moreover, as for module 142 having a large number of chips 140 disposed therein as shown in FIG. 16, the method according to JP-A-2004-363327 cannot equalize the temperatures of chips 140.

The present invention is directed to overcoming or at least reducing the effects of one or more of the problems set forth above.

SUMMARY OF THE INVENTION

In order to solve the foregoing problems, the invention provides a semiconductor device which can attain equalization of a temperature distribution in a surface of a chip and equalization of a temperature distribution among chips.

According to a first configuration of the invention, there is provided a semiconductor device including: an MOS type switching element; a diode composed of series-connected diode parts and having an anode side connected to a gate of the switching element, and a cathode side connected to an emitter or source of the switching element; a gate pad; and a resistor having one end connected to a junction of the gate of the switching element and the anode side of the diode, and the other end connected to the gate pad; wherein: temperature dependence of a forward voltage drop (on-voltage) of the diode is used for reducing a voltage applied to the gate to thereby reduce a current flowing in the switching element when the switching element rises in temperature.

According to a second configuration of the invention, there is provided a semiconductor device defined in the first configuration, wherein: the gate of the switching element is separated into gate groups; diodes each composed of series-connected diode parts are provided so individually as to correspond to the gate groups respectively; each of the diodes has an anode side connected to a corresponding one of the gate groups, and a cathode side connected to the emitter or source of the switching element; resistors are provided so as to correspond to the diodes; and each of the resistors has one end connected to the anode side of a corresponding one of the diodes, and the other end connected to the gate pad.

According to a third configuration of the invention, there is provided a semiconductor device defined in the first or second configuration, wherein: each diode may be a Zener diode made of polysilicon.

According to a fourth configuration of the invention, there is provided a semiconductor device according to the first or second configuration, wherein: each resistor may be made of polysilicon.

According to a fifth configuration of the invention, there is provided a semiconductor device defined in the first or second configuration, wherein: a diode composed of series-connected diode parts may be back-to-back connected to each diode composed of series-connected diode parts.

According to a sixth configuration of the invention, there is provided a semiconductor device defined in any one of the first to fifth configurations, wherein: the switching element may be an IGBT or an MOSFET.

According to a seventh configuration of the invention, there is provided a semiconductor device defined in any one of the first to sixth configurations, wherein: the switching element may be of a trench gate type or of a planar gate type.

According to an eighth configuration of the invention, there is provided a semiconductor device including: a first semiconductor region (semiconductor substrate) of a first conductivity type; a second semiconductor region (base region) of a second conductivity type disposed selectively on a surface of the first semiconductor region; an insulating film (thick insulating film) disposed selectively on the second semiconductor region; a Zener diode and a resistor (polysilicon resistor) formed on the insulating film; a third semiconductor region (emitter region or source region) of the first conductivity type disposed selectively on a surface of the second semiconductor region; a gate electrode disposed, through a gate insulating film connected to the insulating film, in the second semiconductor region exposed while sandwiched between the third semiconductor region and the first semiconductor region; a gate wiring disposed on the insulating film so as to be connected to the gate electrode; a connection wiring which connects one end of the resistor to an anode side of the Zener diode and the gate wiring; a gate pad connected to the other end of the resistor; and a low potential side main electrode (emitter electrode or source electrode) disposed so as to abut on a cathode side of the Zener diode and the third semiconductor region.

According to a ninth configuration of the invention, there is provided a semiconductor device defined in the eighth configuration, wherein: the gate wiring is separated into gate wiring groups; Zener diodes are provided so individually as to correspond to the gate wiring groups respectively; each of the Zener diodes has an anode side connected to a corresponding one of the gate wiring groups, and a cathode side connected to the low potential side main electrode; resistors are provided so as to correspond to the gate wiring groups; and each of the resistors has one end connected to a junction of the anode side of a corresponding one of the Zener diodes and a corresponding one of the gate wiring groups, and the other end connected to the gate pad.

According to a tenth configuration of the invention, there is provided a semiconductor device defined in the eighth or ninth configuration, wherein: a metal gate wiring is disposed on the gate wiring so that the metal gate wiring is connected to the gate wiring and connected to the connection wiring.

According to an eleventh configuration of the invention, there is provided a semiconductor device defined in any one of the eighth to tenth configurations, wherein: the connection wiring, the metal gate wiring and the low potential side main electrode may be metal films made of the same material with the same thickness.

According to the invention, an IGBT is separated into groups (IGBT portions), Zener diodes each composed of series-connected Zener diode parts are disposed so as to correspond to the groups respectively, and each of the Zener diodes has an anode side connected to a gate of a corresponding one of the groups, and a cathode side connected to an emitter of the corresponding group. Temperature dependence of a forward voltage drop of each Zener diode is used for reducing a gate voltage of a group rising in temperature to throttle a current flowing in the group to lower the temperature of the group to thereby attain equalization of the temperature in a surface of a chip.

Moreover, as for a module having a large number of chips disposed therein, a Zener diode composed of series-connected Zener diode parts is disposed in each chip and has an anode side connected to a gate of the chip, and a cathode side connected to an emitter of the chip, so that the temperatures of all the chips can be equalized.

In this manner, equalization of a temperature distribution in a surface of a chip and equalization of a temperature distribution among chips can be attained so that a highly reliable semiconductor device can be provided.

Moreover, because it is unnecessary to give any excessive margin to the size of each chip and the design of heat radiation, effective use of resources can be attained.

BRIEF DESCRIPTION OF THE DRAWINGS

The foregoing advantages and features of the invention will become apparent upon reference to the following detailed description and the accompanying drawings, of which:

FIGS. 2A to 2C are configuration views of the semiconductor device according to Embodiment 1 of the invention, in which

FIGS. 3A to 3C are configuration views of the semiconductor device according to Embodiment 1 of the invention, in which

FIGS. 4A and 4B are configuration views of the semiconductor device according to Embodiment 1 of the invention, in which

FIGS. 5A to 5C are configuration views after a Zener diode and a polysilicon resistor are formed, in which

FIGS. 10A and 10B are configuration views of a semiconductor device according to Embodiment 4 of the invention, in which

FIGS. 14A and 14B are plan views schematically showing temperature distributions in an IGBT chip, in which

DETAILED DESCRIPTION OF SPECIFIC EMBODIMENTS

Figure 11:
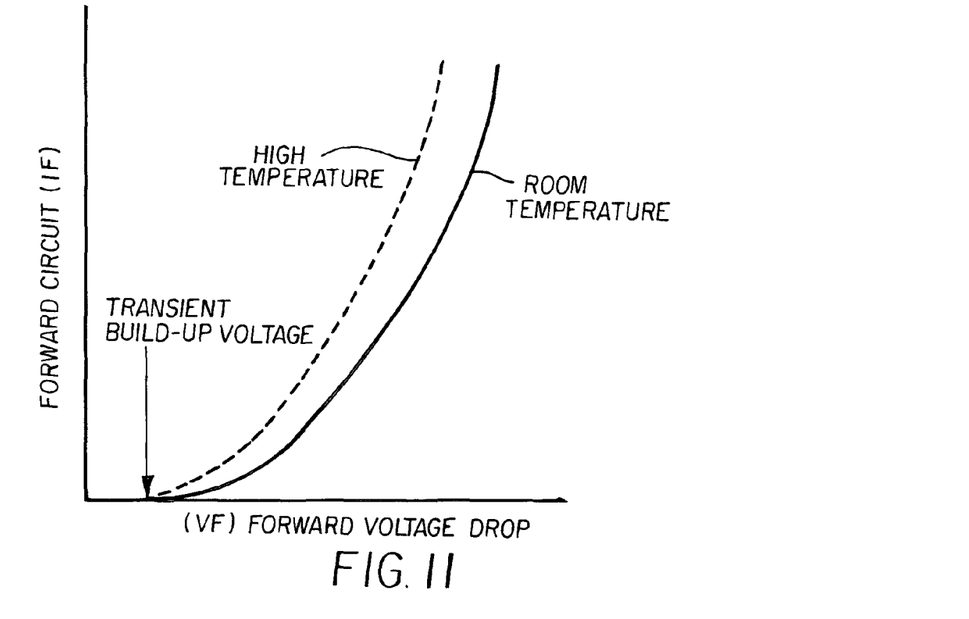
FIG. 11 is a graph of a forward voltage drop (VF) curve of a diode.
Figure 12:
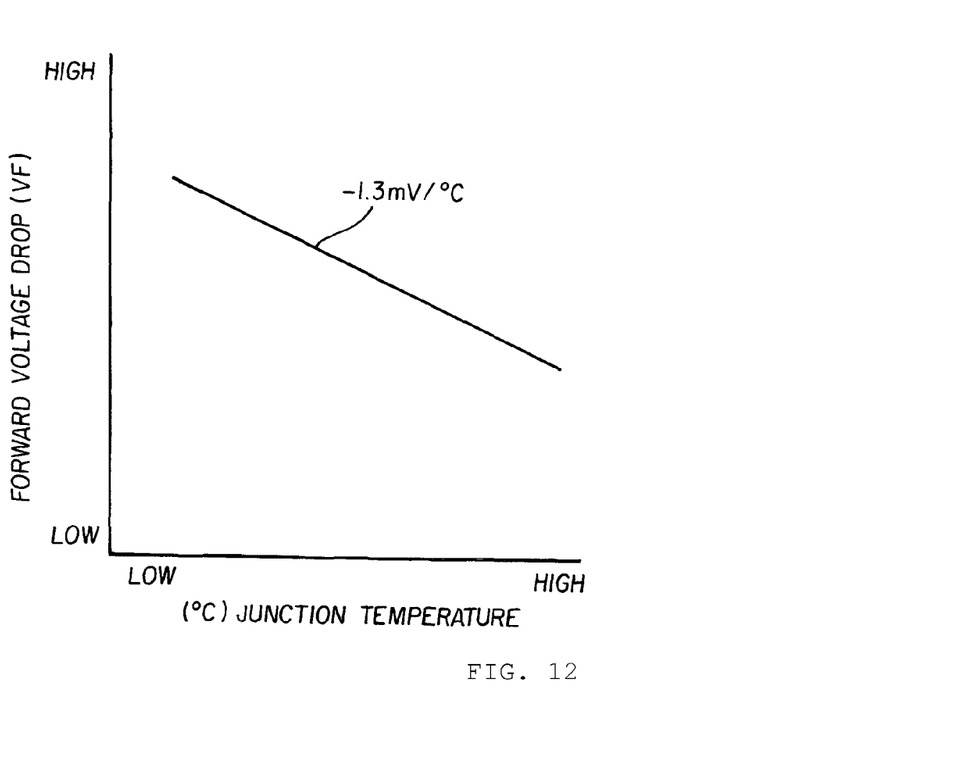
FIG. 12 is a characteristic graph showing temperature dependence of VF of a Zener diode made of polysilicon.

As shown in FIG. 11, the forward voltage drop (VF) of a diode generally has temperature dependence that the forward voltage drop decreases as the temperature increases. For example, a Zener diode made of polysilicon has temperature dependence of −1.3 mV/° C. as shown in FIG. 12.

The invention is designed so that the Zener diode having temperature dependence is connected between a gate and an emitter of an MOS type semiconductor device to reduce a gate voltage at the time of temperature rise to thereby suppress a current flowing in the semiconductor device to equalize a temperature in a surface of a chip or temperatures among chips constituting a module.

The invention will be described based on the following embodiments. Although description will be made in the case where the first conductivity type is an n type and the second conductivity type is a p type, first and second conductivity types may be reversed to each other.

Embodiment 1

Figure 1:
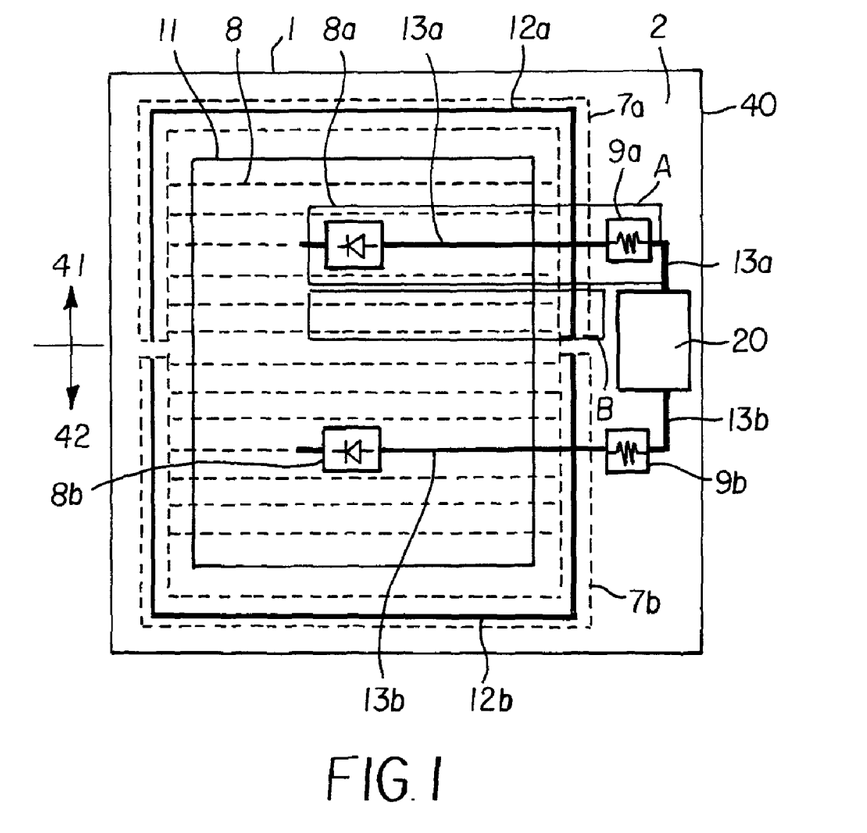
FIG. 1 is a plan view of an important part of a semiconductor device according to Embodiment 1 of the invention.
Figure 2A:
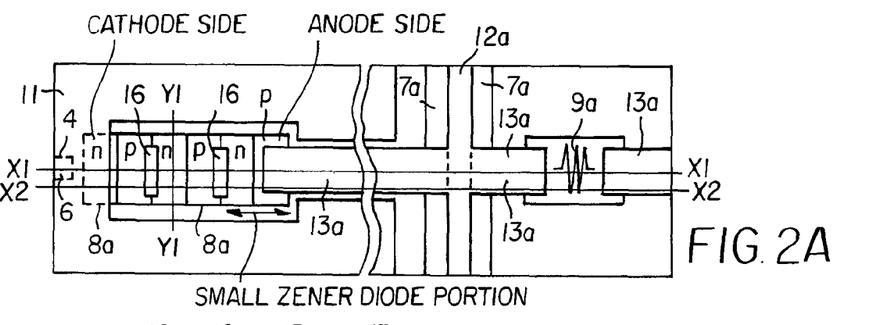
FIG. 2A is a detailed view of a portion A in FIG. 1.
Figure 2B:
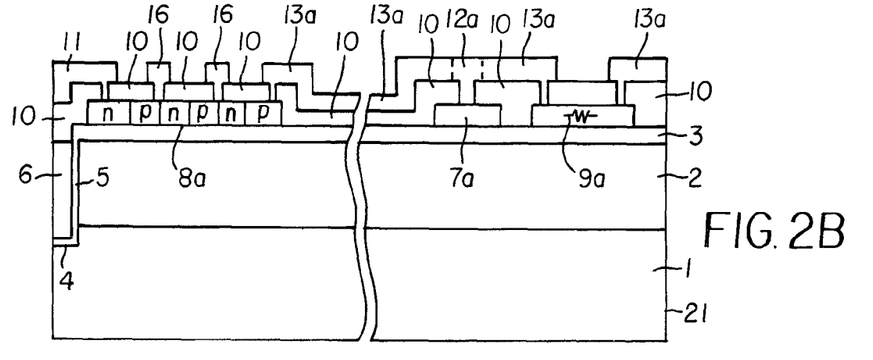
FIG. 2B is a sectional view of an important part, taken along the line X1-X1 in FIG. 2A.
Figure 2C:
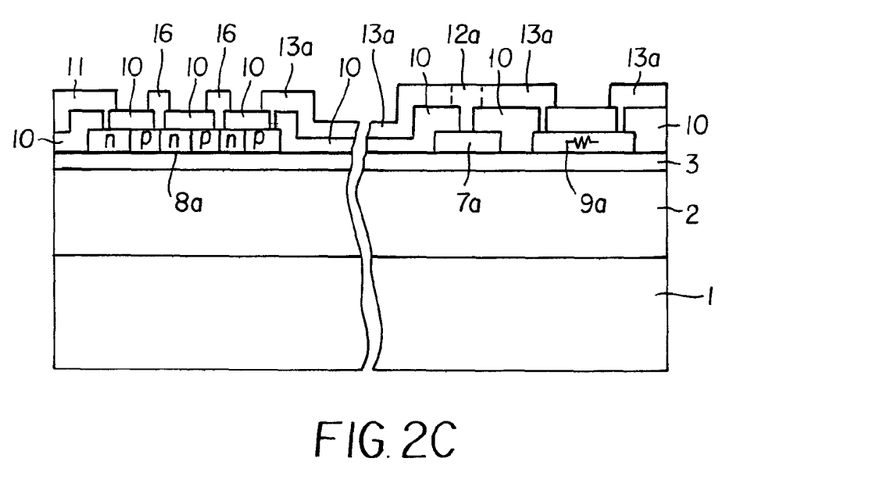
FIG. 2C is a sectional view of an important part, taken along the line X2-X2 in FIG. 2A.
Figure 3A:
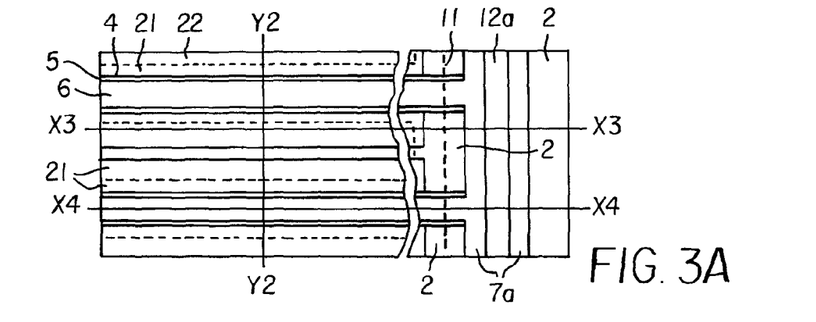
FIG. 3A is a detailed view of a portion B in FIG. 1.
Figure 3B:
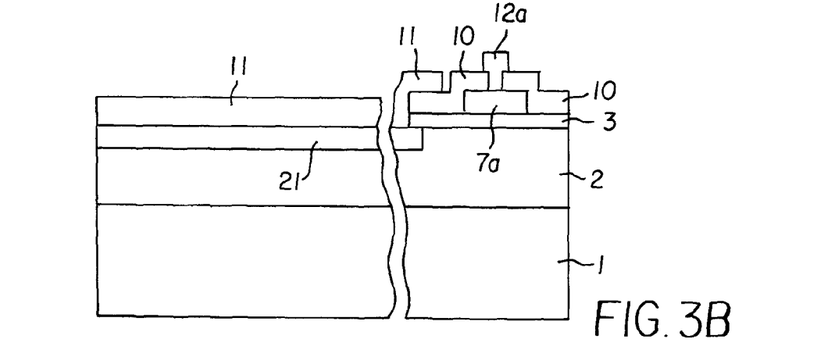
FIG. 3B is a sectional view of an important part, taken along the line X3-X3 in FIG. 3A.
Figure 3C:
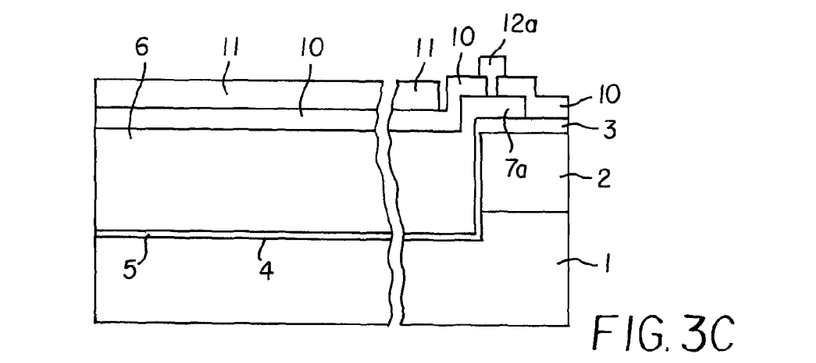
FIG. 3C is a sectional view of an important part, taken along the line X4-X4 in FIG. 3A.
Figure 4A:
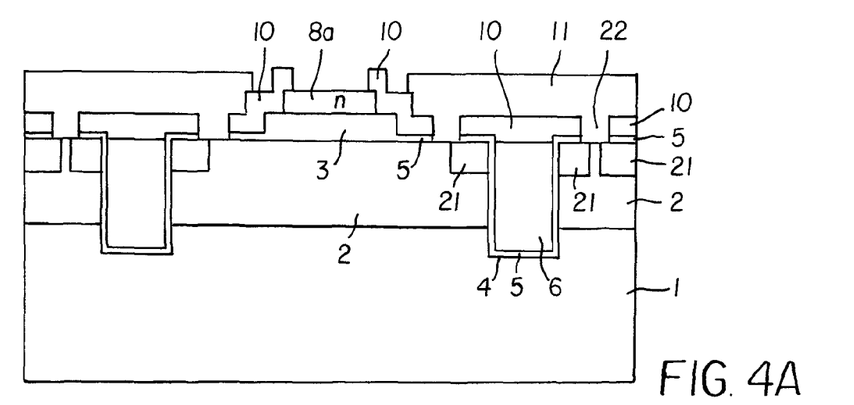
FIG. 4A is a sectional view of an important part, taken along the line Y1-Y1 in FIG. 2A.
Figure 4B:
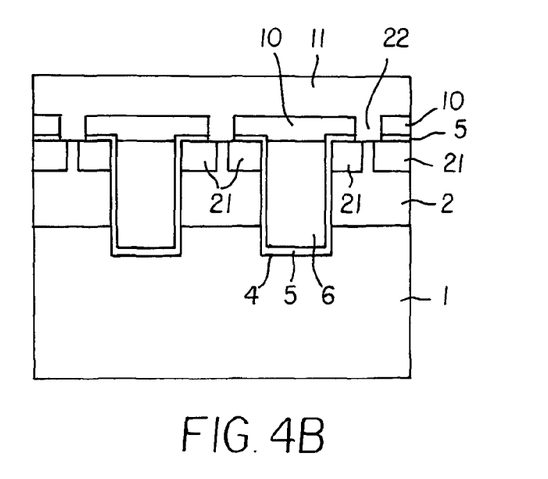
FIG. 4B is a sectional view of important part, taken along the line Y2-Y2 in FIG. 3A.

FIGS. 1, 2A to 2C, 3A to 3C, 4A and 4B are configuration views of a semiconductor device according to Embodiment 1 of the invention. FIG. 1 is a plan view schematically showing an important part of the semiconductor device. FIG. 2A is a detailed view of a portion A in FIG. 1. FIG. 2B is a sectional view of an important part, taken along the line X1-X1 in FIG. 2A. FIG. 2C is a sectional view of an important part, taken along the line X2-X2 in FIG. 2A. FIG. 3A is a detailed view of a portion B in FIG. 1. FIG. 3B is a sectional view of an important part, taken along the line X3-X3 in FIG. 3A. FIG. 3C is a sectional view of an important part, taken along the line X4-X4 in FIG. 3A. FIG. 4A is a sectional view of an important part, taken along the line Y1-Y1 in FIG. 2A. FIG. 4B is a sectional view of an important part, taken along the line Y2-Y2 in FIG. 3A. Description will be made here in the case where a trench gate type IGBT is taken as an example.

The semiconductor device includes striped trenches 4 disposed in a surface of n semiconductor substrate 1, p base region 2 disposed on the surface of n semiconductor substrate 1 being in contact with side walls of trenches 4, n emitter regions 21 disposed in a surface of p base region 2 so as to be in contact with the side walls of trenches 4, and emitter electrode 11 disposed on n emitter regions 21.

The semiconductor device further includes gate electrodes 6 disposed in p base region 2 sandwiched between n emitter regions 21 and n semiconductor substrate 1 and exposed in the side walls of trenches 4 so that trenches 4 are filled with gate electrodes 6 through gate insulating film 5 (such as a gate oxide film) respectively, inter-layer insulating film 10 disposed on gate electrodes 6, first and second polysilicon gate wirings 7a and 7b disposed on thick insulating film 3 (such as an LOCOS film or a thick oxide film) so as to extend from trenches 4 to the surface while being in contact with gate electrodes 6, and first and second metal gate wirings 12a and 12b disposed so as to be connected to polysilicon gate wirings 7a and 7b respectively.

The semiconductor device further includes first and second Zener diodes 8a and 8b made of polysilicon and disposed on thick insulating film 3 disposed on p base region 2 between trenches 4, and first and second polysilicon resistors 9a and 9b disposed on thick insulating film 3 disposed under first and second polysilicon gate wirings 7a and 7b so as to be separate from first and second polysilicon gate wirings 7a and 7b respectively.

The semiconductor device further includes first and second metal connection wirings 13a and 13b for connecting gate pad 20 to anode sides of first and second Zener diodes 8a and 8b, first and second metal gate wirings 12a and 12b and first and second polysilicon resistors 9a and 9b respectively, and emitter electrode 11 disposed on inter-layer insulating film 10 so as to be in contact with n emitter regions 21 and p base region 2 through contact holes 22. Cathode sides of first and second Zener diodes 8a and 8b are connected to emitter electrode 11.

Though not shown, the semiconductor device further includes a p collector region formed on a rear surface layer of n semiconductor substrate 1, and a collector electrode formed on the p collector region. When an n+ region is formed on the rear surface layer of n semiconductor substrate 1, an MOSFET is formed.

In FIGS. 1, 2A to 2C, 3A to 3C, 4A and 4B, trenches 4 and n emitter regions 21 are shaped like stripes in plan view. First and second polysilicon gate wirings 7a and 7b are separated from each other by the center of chip 40 in an up-down direction. Consequently, the semiconductor device is separated into first IGBT portion 41 and second IGBT portion 42. First IGBT portion 41 is driven by gate electrodes 6 connected to first polysilicon gate wiring 7a. Second IGBT portion 42 is driven by gate electrodes 6 connected to second polysilicon gate wiring 7b.

Figure 5A:
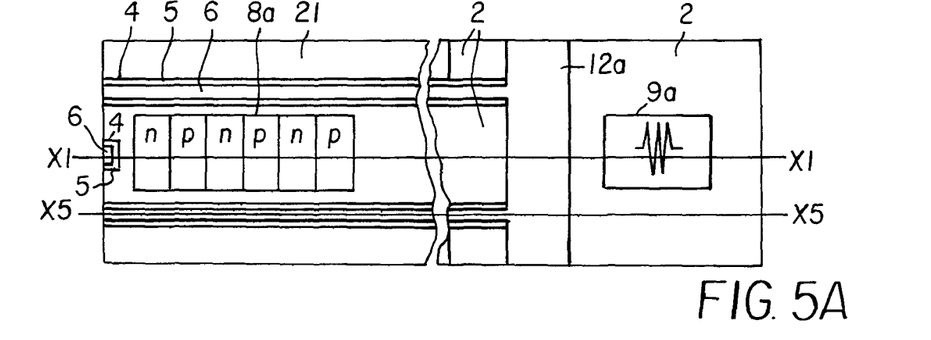
FIG. 5A is a plan view of an important part.
Figure 5B:
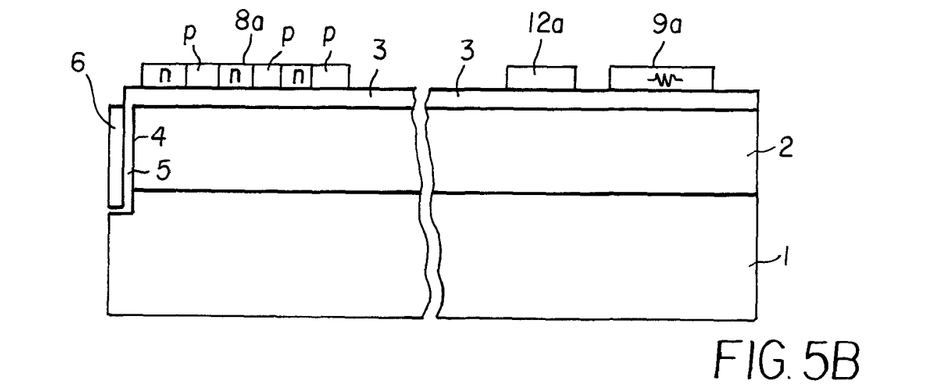
FIG. 5B is a sectional view of an important part, taken along the line X1-X1 in FIG. 5A.
Figure 5C:
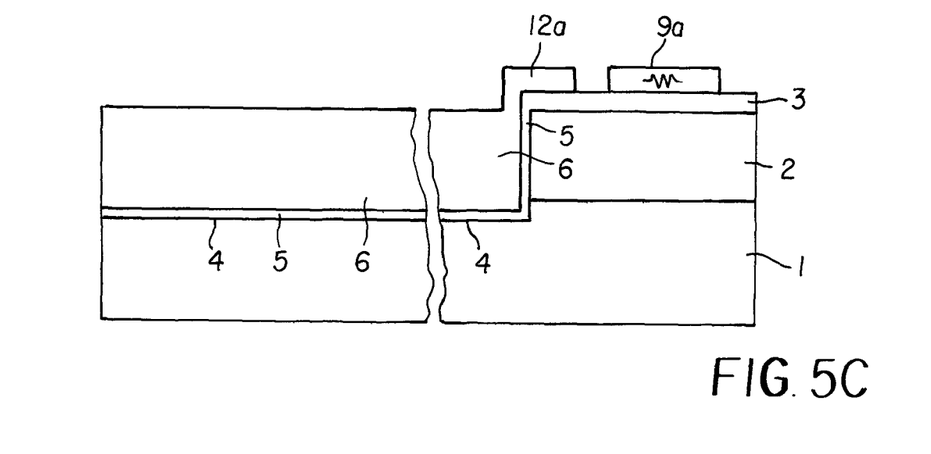
FIG. 5C is a sectional view of an important part, taken along the line X5-X5 in FIG. 5A.

FIGS. 5A to 5C are configuration views after the Zener diodes and the polysilicon resistors are formed. FIG. 5A is a plan view of an important part. FIG. 5B is a sectional view of an important part, taken along the line X1-X1 in FIG. 5A. FIG. 5C is a sectional view of important part, taken along the line X5-X5 in FIG. 5A. FIG. 5A is a configuration view corresponding to FIG. 2A. However, trenches 4, gate insulating film 5 and gate electrodes 6 are not shown in FIG. 2A.

First and second polysilicon gate wirings 12a and 12b formed on thick insulating film 3 are formed simultaneously with gate electrodes 6 in such a manner that first and second polysilicon gate wirings 12a and 12b are doped with an n type impurity. First and second Zener diodes 8a and 8b and first and second polysilicon resistors 9a and 9b are formed in such a manner that polysilicon films which have not been doped with any impurities yet are formed simultaneously and then doped with a p type impurity and an n type impurity.

In the IGBT shown in FIG. 1, when a large current flowing in first IGBT portion 41 to cause a temperature rise in first IGBT portion 41, the temperature of first Zener diode 8a also increases. As the temperature of first Zener diode 8a increases, the forward voltage drop VFT (total VF) of first Zener diode 8a decreases. The voltage of first metal gate wiring 12a connected to first Zener diode 8a by first metal connection wiring 13a decreases. Then, the voltage of first polysilicon gate wiring 7a connected to first metal gate wiring 12a decreases, so that the voltage of gate electrodes 6 of first IGBT portion 41 connected to first polysilicon gate wiring 7a decreases to thereby reduce the current flowing in first IGBT portion 41.

When reduction of the current flowing in first IGBT portion 41 causes a temperature drop in first IGBT portion 41, the temperature difference between first IGBT portion 41 and second IGBT portion 42 is reduced to equalize the temperature distribution in a surface of chip 40.

Figure 6:
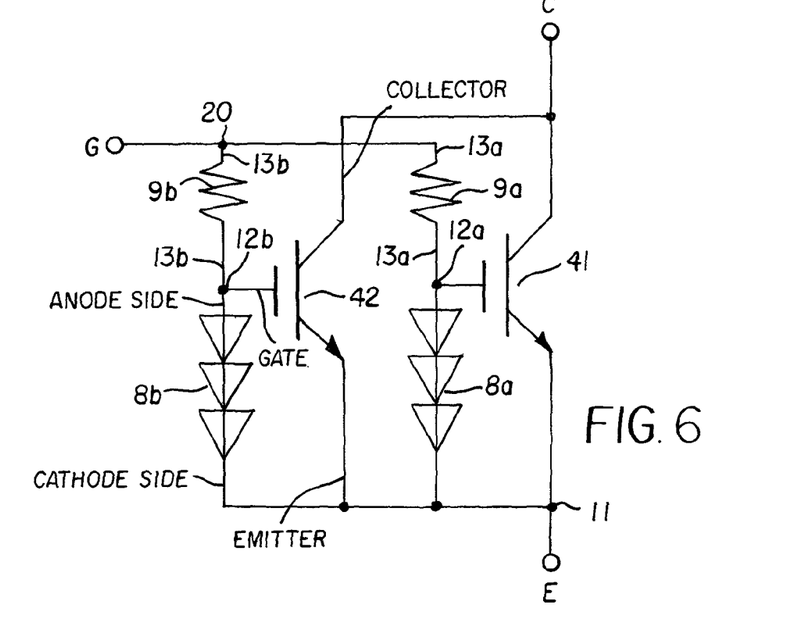
FIG. 6 is an equivalent circuit diagram of an IGBT in FIG. 1.

FIG. 6 is an equivalent circuit diagram of the IGBT in FIG. 1. Cathode sides (n layer) and anode sides (p layer) of first and second Zener diodes 8a and 8b each provided as series-connected Zener diode parts are connected between emitters (emitter electrode 11) and gates (each of first and second polysilicon gate wirings 12a and 12b) of first and second IGBT portions 41 and 42 respectively.

Figure 7:
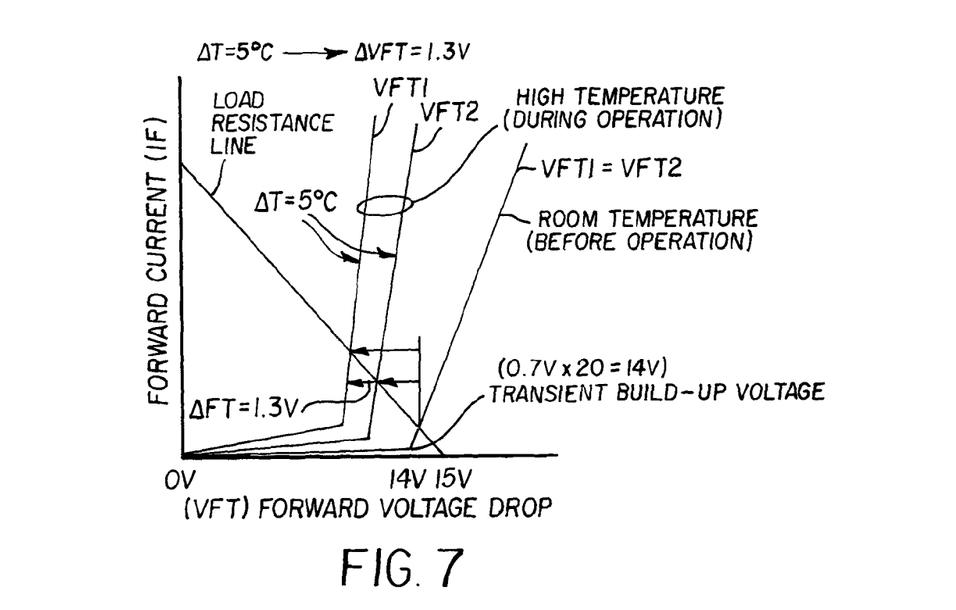
FIG. 7 is a characteristic graph for explaining the operation of the IGBT.

FIG. 7 is a characteristic graph for explaining the operation of the IGBT. In FIG. 7, series-connected Zener diode parts are regarded as one Zener diode. The forward voltage drop of the Zener diode is VFT (total VF). When the forward voltage drop of one Zener diode part is VF and the number of series-connected Zener diode parts is N, VFT is equal to VF×N. VFT1 is the total VF of first Zener diode 8a, and VFT2 is the total VF of second Zener diode 8b. A resistance value on the load resistance line is the resistance value of each of the polysilicon resistors 9a and 9b connected in series with Zener diodes 8a and 8b respectively.

The value of VFT is set to be near the voltage of a gate signal given from gate pad 20 when the IGBT operates in a steady state. When, for example, the voltage of the gate signal is 15V, the forward voltage drop VFT of each Zener diode is set to be 14V. The number N of series-connected Zener diode parts to make VFT equal to 14V is 14V/0.7V=20, that is, 20 Zener diode parts are connected in series. 0.7V is the transient build-up voltage of one Zener diode part.

The temperature characteristic of VF of one Zener diode part made of polysilicon is $-1.3$ mV/° C. Accordingly, the temperature dependence of VFT of series-connected 20 Zener diode parts is $-1.3$ mV/° C.×20=$-26$ mV/° C.

Assume that the temperature of first IGBT portion 41 increases by 5° C. for some reason at the time of operation of the IGBT compared with that of the second IGBT portion 42.

The VFT of first Zener diode 8a changes by $-26$ mV/° C.×5° C.=$-0.13$V for 5° C. Accordingly, the gate voltage applied to the gate electrode 6 of first IGBT portion 41 is 15V−0.13V=14.87V.

Because the reduced gate voltage is applied, the current flowing in first IGBT portion 41 is throttled. Then, the temperature of first IGBT portion 41 decreases to be close to the temperature of the second IGBT portion 42 to thereby equalize the temperature of the whole chip 40.

Assuming that the current flowing in the IGBT is constant, then the current flowing in second IGBT portion 42 increases by reduction of the current flowing in first IGBT portion 41 to thereby attain equalization of the temperature more rapidly.

In this manner, because the current flowing in a place of occurrence of a temperature rise is throttled to reduce the temperature in that place when the temperature rise occurs locally at the time of operation of the IGBT, the IGBT can be operated while the temperature in a surface of chip 40 is always equalized. Particularly because a large number of Zener diodes can be disposed in a range of from the central portion to the end portion of chip 40, more sufficient equalization of the temperature in a surface of chip 40 can be attained.

Although the aforementioned example shows the case where 20 Zener diode parts are connected in series, the number N of Zener diode parts is not limited thereto but depends on the voltage magnitude of a gate signal given to an IGBT, the temperature level of a chip to be subjected to temperature equalization, etc. When, for example, the temperature level is high, the number N of Zener diode parts increases because it is necessary to increase the transient build-up voltage of VFT at room temperature.

Embodiment 2

Figure 8:
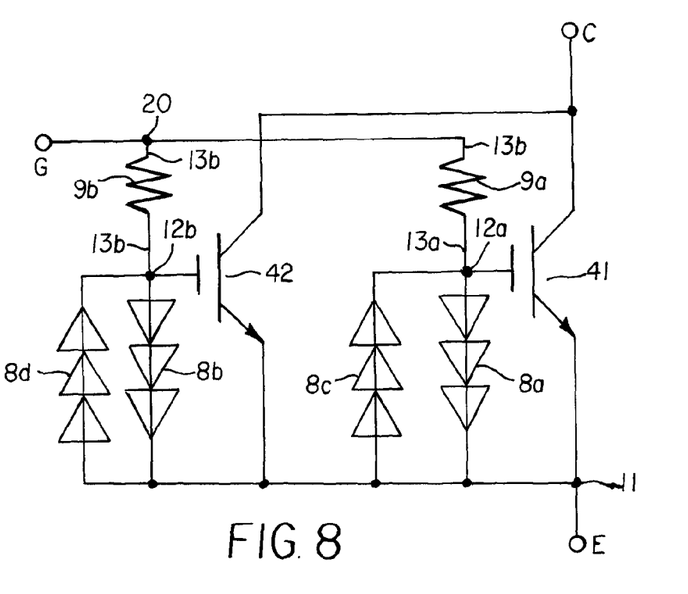
FIG. 8 is an equivalent circuit diagram of a semiconductor device according to Embodiment 2 of the invention.

FIG. 8 is an equivalent circuit diagram of a semiconductor device according to Embodiment 2 of the invention. The point of difference from FIG. 1 lies in that Zener diodes are connected to each other back-to-back. In FIG. 1, the backward withstand voltage of each Zener diode reaches several hundred V or more because each Zener diode is composed of a large number of series-connected Zener diode parts. For this reason, when a high backward surge voltage is applied to a gate of an IGBT, the IGBT is broken down. When Zener diodes 8c and 8d each having the same number of series-connected Zener diode parts as those of Zener diodes 8a and 8b, and Zener diodes 8a and 8b are back-to-back connected as shown in FIG. 8 to protect each IGBT from breakdown, an excessive backward voltage is prevented from being applied to the gate of the IGBT, so that the IGBT can be prevented from breakdown.

Zener diodes 8c and 8d may be formed simultaneously with the Zener diodes 8a and 8b.

Embodiment 3

Figure 9:
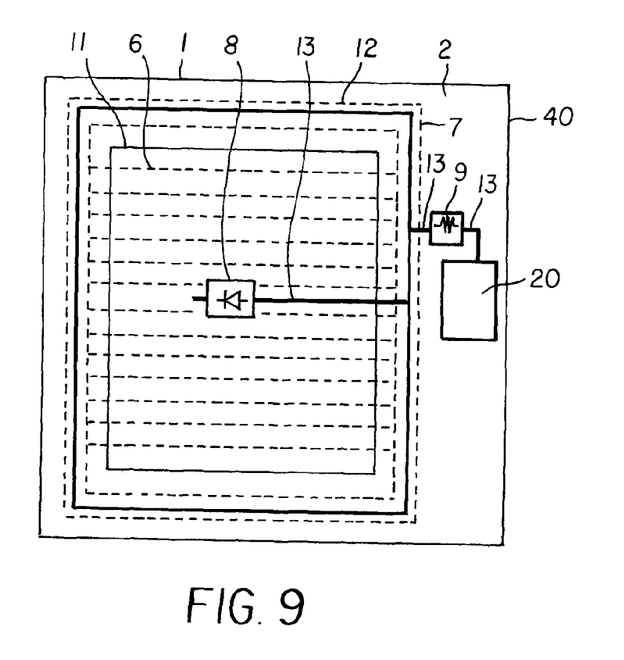
FIG. 9 is a plan view of an important part of a semiconductor device according to Embodiment 3 of the invention.

FIG. 9 is a plan view of important part of a semiconductor device according to Embodiment 3 of the invention. The point of difference from FIG. 1 lies in that one Zener diode 8 and one polysilicon resistor 9 are formed in a chip 40.

Embodiment 3 becomes effective for a module having a large number of chips 40 disposed therein as described with reference to FIG. 16. Also in this case, equalization of temperatures among the chips can be attained because the gate voltage of high-temperature chip 40 is reduced to throttle a current flowing in high-temperature chip 40.

Embodiment 4

Figure 10A:
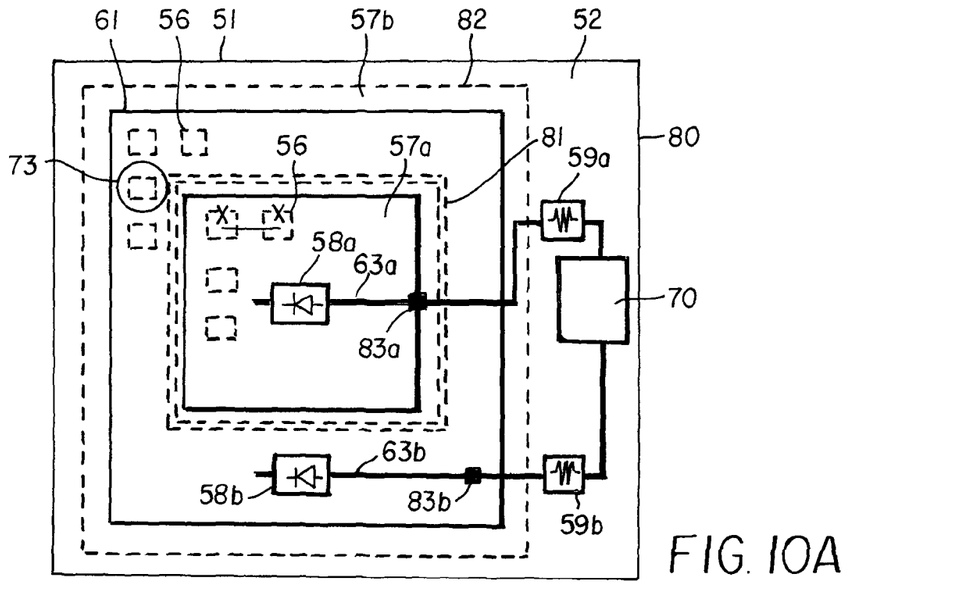
FIG. 10A is a plan view of an important part.
Figure 10B:
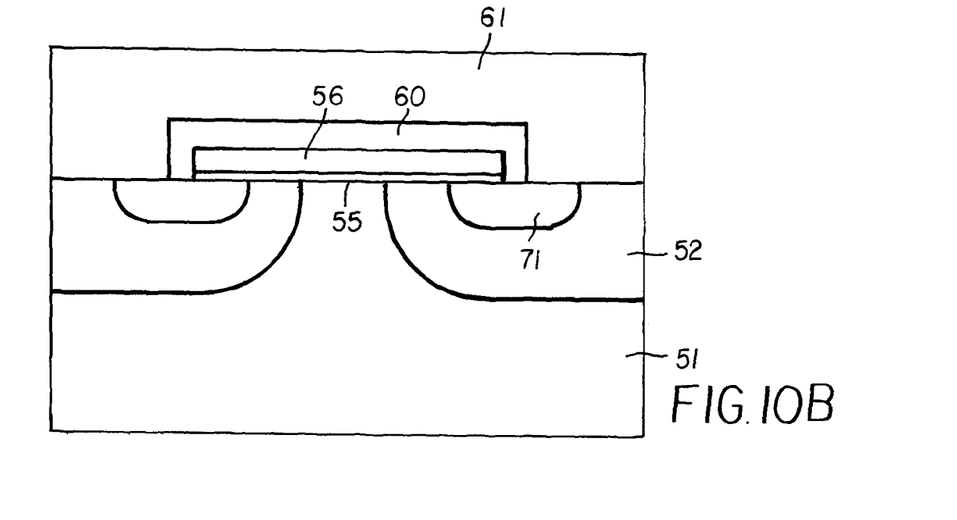
FIG. 10B is a sectional view of an important part, taken along the line X-X in FIG. 10A.

FIGS. 10A and 10B are configuration views of a semiconductor device according to Embodiment 4 of the invention. FIG. 10A is a plan view of an important part of the semiconductor device. FIG. 10B is a sectional view of an important part, taken along the line X-X in FIG. 10A. The point of difference from FIG. 1 lies in that gates are formed not as trench gates but as planar gates while cells are shaped not like stripes but like islands (dot cells 73).

Embodiment 4 becomes particularly effective in the case where the temperature of the central portion of chip 80 rises as shown in FIG. 14A because first polysilicon gate wiring 57a can be surrounded by second polysilicon gate wiring 57b. Moreover, because the polysilicon gate wiring can be separated at any place, it is easy to attain equalization of temperatures in chip 80 compared with the case where the cells are shaped like stripes.

Incidentally, the reference numerals in the drawings will be described. Reference numeral 51 designates n semiconductor substrate; 52, a p base region; 55, a gate insulating film; 56, a gate electrode; 57a and 57b, first and second polysilicon gate wirings; 58a and 58b, first and second Zener diodes; 59a and 59b, first and second polysilicon resistors; 60, an inter-layer insulating film; and 61, an emitter electrode.

Reference numerals 63a and 63b designate first and second metal connection wirings which connect first and second Zener diodes 58a and 58b and first and second polysilicon resistors 59a and 59b to a gate pad 70; 71, an n emitter region; 73, a dot cell; 80, a chip; 81, a first IGBT portion; and 82, a second IGBT portion.

Reference numeral 83a designates a first junction of first polysilicon gate wiring 57a and first metal connection wiring 63a; and 83b, a second junction of second polysilicon gate wiring 57b and second metal connection wiring 63b. When metal gate wirings are to be formed on polysilicon gate wirings 57a and 57b respectively, metal connection wirings 63a and 63b are connected to the metal gate wirings respectively. The points of these connections are junctions 83a and 83b.

Although Embodiments 1 to 4 have been described in the case where an IGBT is used as an example of the semiconductor device, it is a matter of course that the invention can be applied to an MOSFET. Although a combination of a Zener diode and a polysilicon resistor is formed on a thick insulating film, the same effect can be obtained in the case where the combination is replaced by a diode and a resistor which are provided separately so that the diode and the resistor are connected to each other by wires after the diode is stuck on an emitter electrode through an insulating film while the resistor is stuck on the peripheral portion of a chip through an insulating film. Sensitivity however becomes slow because the Zener diode detects the temperature not only on the emitter electrode but also through the insulating film.

Thus, a semiconductor device and method of making the same have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2009-145554, filed on Jun. 18, 2009. The disclosure of the priority application in its entirety, including the drawings, claims, and the specification thereof, is incorporated herein by reference.

What is claimed is:

1. A semiconductor device comprising:
   an MOS type switching element;
   a diode composed of series-connected diode parts and having an anode side connected to a gate of the switching element, and a cathode side connected to an emitter or source of the switching element;
   a gate pad; and
   a resistor having one end connected to a junction of the gate of the switching element and the anode side of the diode, and the other end connected to the gate pad; wherein:
   temperature dependence of a forward voltage drop of the diode reduces a voltage applied to the gate to thereby reduce current flowing in the switching element when the switching element rises in temperature.

2. A semiconductor device according to claim 1, wherein the gate of the switching element is separated into gate groups;
   diodes each composed of series-connected diode parts are provided individually so as to correspond to the gate groups respectively;
   each of the diodes has an anode side connected to a corresponding one of the gate groups, and a cathode side connected to the emitter or source of the switching element; resistors are provided so as to correspond to the diodes; and
   each of the resistors has one end connected to the anode side of a corresponding one of the diodes, and the other end connected to the gate pad.

3. A semiconductor device according to claim 1, wherein each diode is a Zener diode made of polysilicon.

4. A semiconductor device according to claim 1, wherein each resistor is made of polysilicon.

5. A semiconductor device according to claim 1, wherein a diode composed of series-connected diode parts is back-to-back connected to each diode composed of series-connected diode parts.

6. A semiconductor device according to claim 1, wherein the switching element is an IGBT or an MOSFET.

7. A semiconductor device according to claim 1, wherein the switching element is of a trench gate type or of a planar gate type.

8. A semiconductor device comprising:
   a first semiconductor region of a first conductivity type;
   a second semiconductor region of a second conductivity type disposed selectively on a surface of the first semiconductor region;
   an insulating film disposed selectively on the second semiconductor region;
   a Zener diode and a resistor formed on the insulating film;

a third semiconductor region of the first conductivity type disposed selectively on a surface of the second semiconductor region;

a gate electrode disposed, through a gate insulating film connected to the insulating film, in the second semiconductor region exposed while sandwiched between the third semiconductor region and the first semiconductor region;

a gate wiring disposed on the insulating film so as to be connected to the gate electrode;

a connection wiring which connects one end of the resistor to an anode side of the Zener diode and the gate wiring;

a gate pad connected to the other end of the resistor; and a low potential side main electrode disposed so as to abut on a cathode side of the Zener diode and the third semiconductor region.

9. A semiconductor device according to claim 8, wherein the gate wiring is separated into gate wiring groups;

Zener diodes are provided individually so as to correspond to the gate wiring groups respectively;

each of the Zener diodes has an anode side connected to a corresponding one of the gate wiring groups, and a cathode side connected to the low potential side main electrode; resistors are provided so as to correspond to the gate wiring groups; and each of the resistors has one end connected to a junction of the anode side of a corresponding one of the Zener diodes and a corresponding one of the gate wiring groups, and the other end connected to the gate pad.

10. A semiconductor device according to claim 8, wherein a metal gate wiring is disposed on the gate wiring so that the metal gate wiring is connected to the gate wiring and connected to the connection wiring.

11. A semiconductor device according to claim 8, wherein the connection wiring, the metal gate wiring and the low potential side main electrode are metal films made of the same material with the same thickness.

* * * * *